United States Patent
Wu

Patent Number: 5,939,900
Date of Patent: Aug. 17, 1999

[54] INPUT BUFFER

[75] Inventor: Te Sun Wu, Hsinchu, Taiwan

[73] Assignee: United Microelectronics Corp., Taiwan

[21] Appl. No.: 08/775,290

[22] Filed: Dec. 31, 1996

[30] Foreign Application Priority Data

Oct. 11, 1996 [TW] Taiwan ................... 85215646

[51] Int. Cl.$^6$ ............ H03K 19/094; H03K 19/20
[52] U.S. Cl. ................ 326/121; 326/119; 326/112
[58] Field of Search ................ 326/121, 119, 326/112

[56] References Cited

U.S. PATENT DOCUMENTS

| | | | |
|---|---|---|---|
| 4,859,870 | 8/1989 | Wong et al. ........................ | 326/62 |
| 5,332,934 | 7/1994 | Hashimoto et al. ................ | 326/121 |
| 5,343,099 | 8/1994 | Shichinohe ......................... | 326/112 |
| 5,594,369 | 1/1997 | Kondoh et al. .................... | 326/121 |

FOREIGN PATENT DOCUMENTS

| | | | |
|---|---|---|---|
| 401094718 | 4/1989 | Japan ........................ | 326/121 |
| 402084816 | 3/1990 | Japan ........................ | 326/121 |
| 403184419 | 8/1991 | Japan ........................ | 326/121 |
| 405304464 | 11/1993 | Japan ........................ | 326/121 |
| 002133242 | 7/1984 | United Kingdom ....... | 326/121 |

OTHER PUBLICATIONS

Horenstein, Microelectronic Circuits & Devices, Prentice-Hall, Inc, pp. 753–755, 1990.

*Primary Examiner*—Michael Tokar
*Assistant Examiner*—Daniel D. Chang
*Attorney, Agent, or Firm*—Rabin & Champagne, P.C.

[57] ABSTRACT

An input buffer which is coupled to a direct voltage source and ground, includes at least one CMOS device and an enhancement mode NMOS transistor, receives at least one input signal and provides one output signal. The input buffer makes use of the enhancement mode NMOS transistor to lower the potential difference between the gate terminal and the source terminal of the PMOS transistor of the CMOS device. Thus, the input buffer can lower the turning on degree of the PMOS transistor effectively. Then the PMOS transistor which is considered as a pull-up transistor can lower the degree to which the input buffer is turned on, and maintain the characteristics and functionality of the input buffer.

3 Claims, 4 Drawing Sheets ical input buffer circuit.
INPUT BUFFER

BACKGROUND OF THE INVENTION

1. Field of the Invention

The invention relates in general to an input buffer, and more particularly to an input buffer which makes use of an enhancement mode NMOS (n-type metal oxide semiconductor) transistor and one or more CMOS (complementary metal oxide semiconductor) device to lower the gate-source voltage $V_{GS}$ (the relative voltage potential between the gate terminal and the source terminal) of the PMOS transistor of the CMOS device. Then, the degree to which the PMOS transistor is turned on can be lowered effectively, to satisfy the purpose of raising the stability of the lowest input voltage $V_{IH}$ representing a logic 1. The main input buffers which are currently in use include the NOR gate, the NAND gate, and the inverter. The input levels $V_{IH}/V_{IL}$ (where $V_{IL}$ is the highest input voltage representing a logic 0) are, for example, 2.2V/0.8V, 3V/0V. In the manufacturing industry, the acceptable standard input level of $V_{IH}$ ranges from 2.2V to 3V, and the acceptable standard input level of $V_{IL}$ ranges from 0V to 0.8V. The PMOS transistor that is considered to be a pull-up transistor, cannot fully turn off the CMOS device, as the voltage $V_{IH}$ is in the range of about 2.2V to 3V. Therefore, the triple point of the input buffer shifts as the direct source voltage $V_{CC}$ shifts. In consequence, the voltage $V_{IH}$ characteristic varies greatly as the direct source voltage $V_{CC}$ varies.

2. Description of the Related Art

FIG. 1 shows a traditional NOR gate input buffer circuit. An enable signal EN is received at the gate terminals of a transistor P2 and a transistor N2. The enable signal EN controls the operation of the NOR gate. When asserted high, that is, when at a logic 1 level, the magnitude of the enable signal EN is about equal to the direct bias voltage potential ($V_{CC}$ or $V_{SS}$, where $V_{SS}$ is a source voltage which is often coupled to the source terminal of the NMOS, transistor of an input buffer). Thus, the CMOS devices (transistors P2 and N2) which receive the enable signal EN, can be fully turned on or off.

An input signal I/P is provided from an external system. The usual input levels $V_{IH}/V_{IL}$ of this TTL (transistor transistor logic) signal are 2.2V/0.8V. If the input level $V_{IH}$ is 2.2V and the direct source voltage $V_{CC}$ is 5V, the gate-source voltage $V_{GS}$ of the transistor P1 equals 2.2V–5V=–2.8V. Because the magnitude of threshold voltage of a PMOS transistor is about 0.6V~0.8V, the magnitude (2.8V) of the voltage $V_{GS}$ is, in general, higher than the threshold voltage of the PMOS transistor in general. Therefore, the transistor P1 turns on. The higher is the direct source voltage $V_{CC}$, the higher is the degree to which the transistor P1 is turned on, that is, the greater is the current that flows through the transistor P1. If the enable signal EN is 0V and the input signal I/P is 2.2V, then the output voltage $V_{OUT}$ is close to the level of the source voltage $V_{SS}$. However, since the degree to which the transistor P1 is turned on is high, the output voltage $V_{OUT}$ rises. In consequence, the output voltage tolerance of the integrated circuit will be wider. In order to maintain the characteristics and functionality of input buffers in a normal state, raising the voltage level $V_{IH}$ is necessary.

FIG. 2 shows a circuit of a traditional input buffer of a NAND gate, and FIG. 3 shows a circuit of a traditional input buffer of an inverter. Both the traditional NAND gate and the traditional inverter have the same problems in maintaining the characteristics and functionality of input buffers.

SUMMARY OF THE INVENTION

Therefore, an object of the invention is to maintain the characteristics and functions of input buffers. When the input signal I/P has a level $V_{IH}$, the magnitude of the gate-source voltage $V_{GS}$ can be lowered by making use of the circuit of the invention. By doing so, the degree to which the PMOS transistor of a CMOS input buffer is turned on can be improved. The sensitivity of the voltage level $V_{IH}$ to a direct source voltage $V_{CC}$ can be lowered. Thus, the characteristics and functions of the transistor can be maintained.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT1

Figure 1:
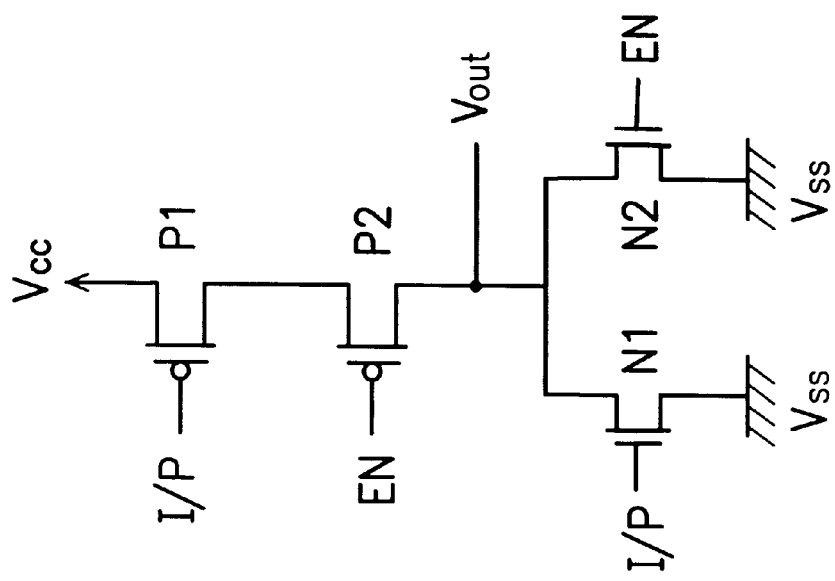
FIG. 1 (Prior Art) is a circuit drawing showing a conventional NOR gate input buffer.
Figure 4:
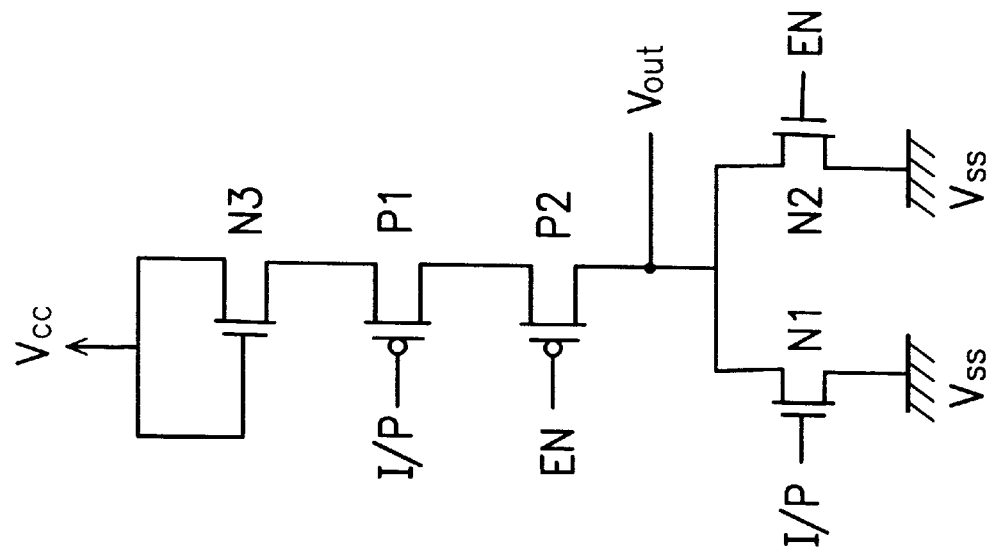
FIG. 4 is a circuit drawing showing a preferred embodiment of a NOR gate input buffer according to the invention.

The conventional input buffer of a NOR gate as shown in FIG. 1 includes at least two CMOS devices, such as the PMOS transistor P1, the NMOS transistor N1, the PMOS transistor P2, and the NMOS transistor N2. In order to form a NOR gate input buffer according to the invention, an enhancement mode NMOS transistor N3 is connected between the direct voltage source $V_{CC}$ and the source terminal of the transistor P1, as shown in FIG. 4, since that the drain and gate of the enhancement mode NMOS transistor N3 are connected to the direct voltage source $V_{CC}$, and the source of N3 is connected to the source of the transistor P1. As FIG. 4 shows, both the gate terminal of the transistor P1 and the gate terminal of the transistor N1 receive the input signal I/P. Both the gate terminal of the transistor P2 and the gate terminal of the transistor N2 receive the enable signal EN. Both the source terminal of the transistor N2 and the source terminal of the transistor N1 are connected to ground. An output signal $V_{OUT}$ is provided from the drain terminal of the transistor P2.

As shown in FIG. 4, according to the invention, the voltage at the source terminal of the transistor P1 will decrease from the conventional magnitude of the direct voltage source $V_{CC}$ to $V_{CC}-V_t$, where $V_t$ is the threshold voltage of the transistor N3. By doing so, according to the invention, when the input signal I/P has a voltage level $V_{IH}$, the magnitude of the gate-source voltage $V_{GS}$ of the transistor P1 decreases from the conventional magnitude of $V_{CC}-V_{IH}$ to $V_{CC}-V_{IH}-V_t$. Then the degree to which the transistor P1 is turned on will be lowered effectively, so that the stability of the voltage level $V_{IH}$ of the input buffer is increased.

DESCRIPTION OF THE PREFERRED EMBODIMENT 2

Figure 2:
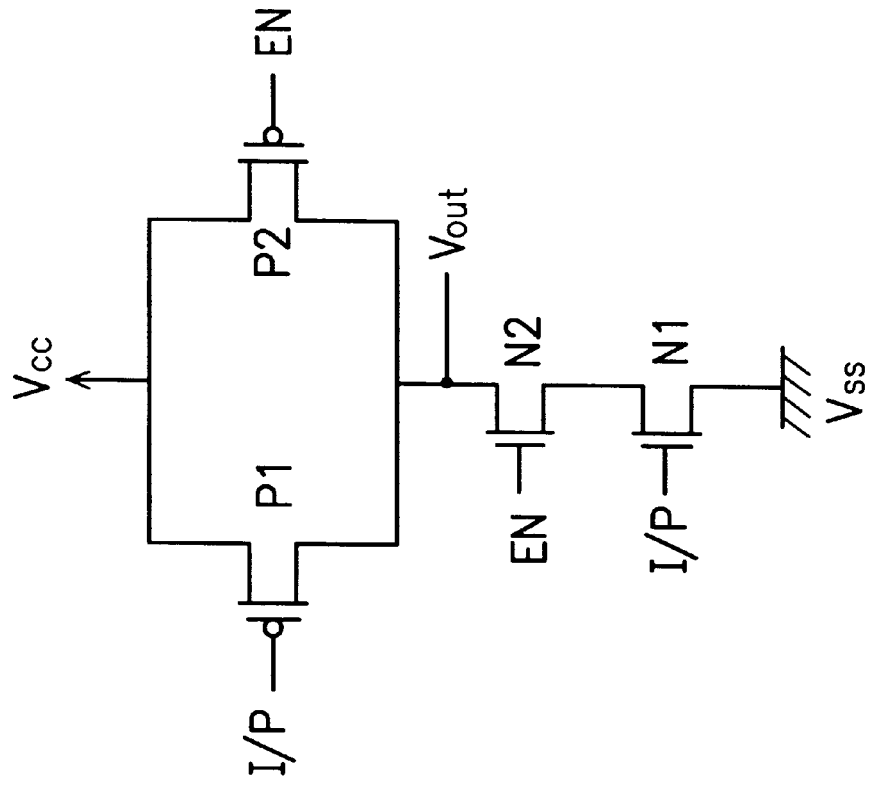
FIG. 2 (Prior Art) is a circuit drawing showing a conventional NAND gate input buffer.
Figure 5:
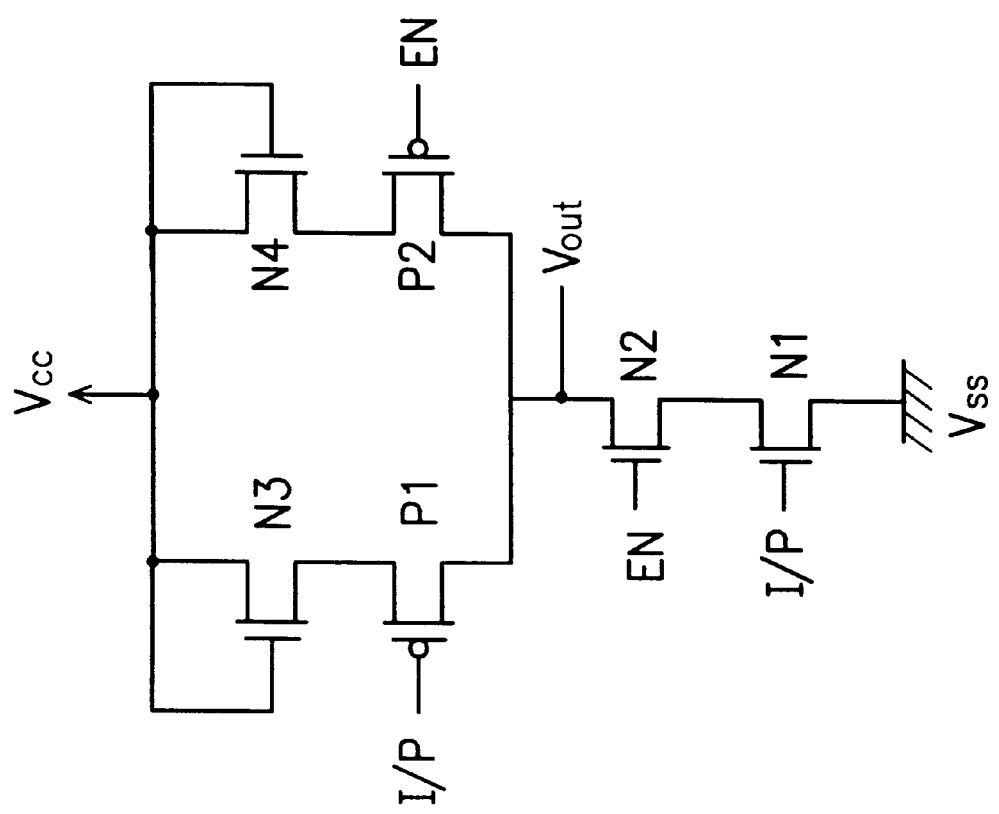
FIG. 5 is a circuit drawing showing a preferred embodiment of a NAND gate input buffer according to the invention.

A conventional NAND gate input buffer as shown in FIG. 2 includes at least two CMOS devices, such as the PMOS transistor P1, the NMOS transistor N1, the PMOS transistor P2, and the NMOS transistor N2. In order to form a NAND gate input buffer according to the invention, an enhancement mode NMOS transistor N3 is connected between the direct voltage source $V_{CC}$ and the source terminal of the transistor P1 and another enhancement mode NMOS transistor N4 is connected between the direct voltage source $_{VCC}$ and the source terminal of the transistor P2, as shown in FIG. 5. Both the drain terminal and gate of the transistor N3 and the drain terminal and gate of the transistor N4 are connected to the direct voltage source $V_{CC}$. The gates of the transistor P1 and the transistor N1 receive the input signal I/P. The gates of the transistor P2 and the transistor N2 receive the enable signal EN. The source terminal of the transistor N1 is connected to ground. An output signal $V_{OUT}$ is provided at the drain terminal of the transistor N2.

The embodiment has the same advantages as that of FIG. 4. Namely, according to the invention, the voltage at the source terminal of the transistor P1 also decreases from the conventional magnitude of the direct voltage source $V_{CC}$ to $V_{CC}-V_t$, where $V_t$ is the threshold voltage of the transistor N3. By doing so, when the input signal I/P is the voltage level $V_{IH}$, the potential $V_{GS}$ of the transistor P1 decreases according to the invention from the conventional magnitude of $V_{CC}-V_{IH}$ to $V_{CC}-V_{IH}-V_t$. Then, the degree to which the transistor P1 is turned on also will be lowered effectively and the stability of the voltage $V_{IH}$ of the input buffer is increased.

DESCRIPTION OF THE PREFERRED EMBODIMENT 3

Figure 3:
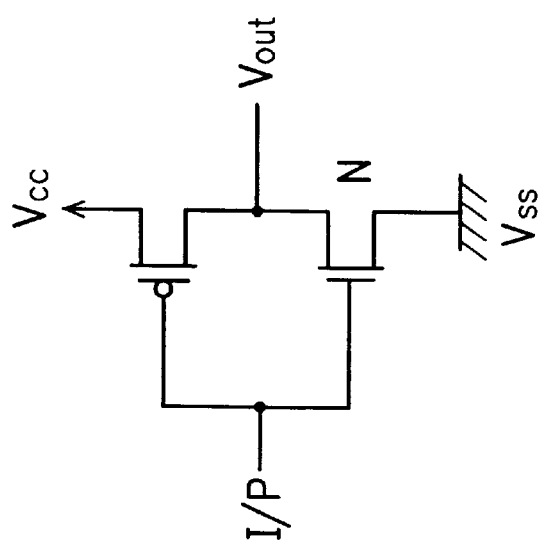
FIG. 3 (Prior Art) is a circuit drawing showing a conventional inverter input buffer.
Figure 6:
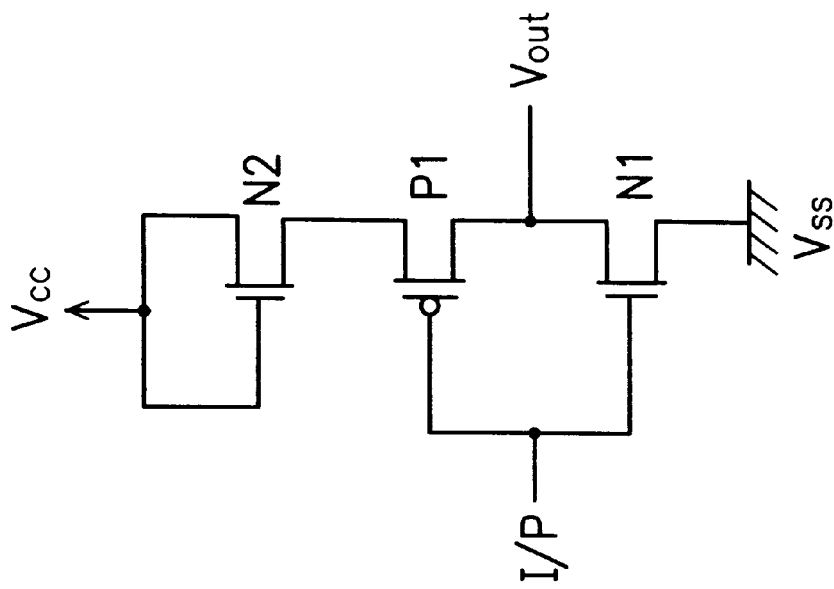
FIG. 6 is a circuit drawing showing a preferred embodiment of an inverter input buffer according to the invention.

A conventional inverter input buffer as shown in FIG. 3 includes at least one PMOS transistor P1 and one NMOS transistor N1. In order to form an inverter input buffer according to the invention, an enhancement mode NMOS transistor N2 is connected between the direct voltage source $V_{CC}$ and the source terminal of the transistor P1, as shown in FIG. 6. The drain terminal and gate of the transistor N2 are connected to the direct voltage source $V_{CC}$ and the source of the transistor N2 is connected to the source of the transition P1. The source terminal of the transistor N1 is connected to ground. The gale of the transistor P1 and the gate of the transistor N1 receive the input signal I/P. An output signal $V_{OUT}$ is provided at the drain terminal of the transistor N1.

This embodiment has the same advantages as those of the first embodiment shown in FIG. 4. Namely, the voltage of the source terminal of the transistor P1 will also decrease from the conventional magnitude of the direct voltage source $V_{CC}$ to $V_{CC}-V_t$, according to the invention, where $V_t$ is the threshold voltage of the transistor N2. By doing so, when the input signal I/P is the voltage level $V_{IH}$, the magnitude of the gate-source voltage $V_{GS}$ of the transistor P1 decreases according to the invention from the conventional magnitude of $V_{CC}-V_{IH}$ to $V_{CC}-V_{IH}-V_t$. Then the degree to which the transistor P1 is turned on is similarly lowered effectively and the stability of the voltage level $V_{IH}$ of the input buffer is increased.

DESCRIPTION OF THE PREFERRED EMBODIMENT 4

The first preferred embodiment as shown in FIG. 4 can increase the stability of the voltage level $V_{IH}$, so that it does not vary widely with the direct voltage source $V_{CC}$, whereas, the maximum output voltage decreases from conventional magnitude $V_{CC}$ to $V_{CC}-V_t$. In consequence, the stability and functionality of the next circuit stage will be influenced for a short time. For example, the lower voltage provides less ability to drive the next stage. In addition, the ability to fan-out is lessened, and the magnitude of the input voltage to the next stage is lower.

Figure 7:
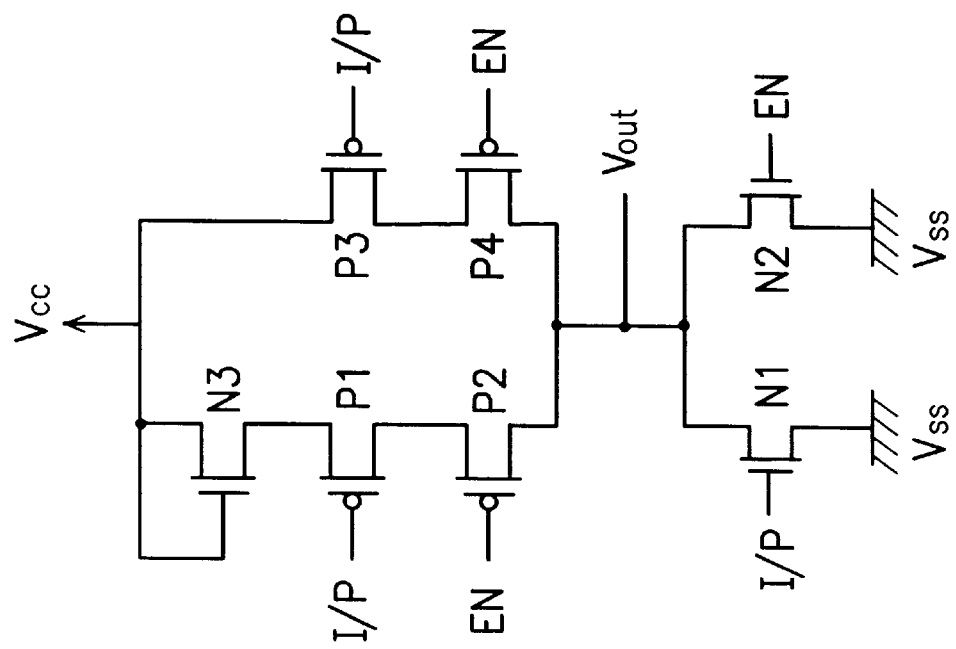
FIG. 7 is a circuit drawing showing another preferred embodiment of a NOR gate input buffer according to the invention.

Compared with the first preferred embodiment, the fourth preferred embodiment of the invention shown in FIG. 7 has two more PMOS transistors, transistors P3 and P4. The gate terminal of the transistor N1, the gate terminal of the transistor P1, and the gate terminal of the transistor P3 all receive the input signal I/P. The gate terminal of the transistor P2, the gate terminal of the transistor N2, and the gate terminal of the transistor P4 all receive the enable signal EN. Both the source terminal of the transistor N1 and the source terminal of the transistor N2 are connected to ground. The enhancement mode NMOS transistor N3 is connected between the direct voltage source $V_{CC}$ and the source terminal of the transistor P1, as shown in FIG. 7. The drain terminal and gate of the transistor N3 are connected to the direct voltage source $V_{CC}$ and the source of the transistor N3 is connected to the source of the transistor P1. The transistor P3 and the transistor P4 are connected to each other in series. The series connected transistors P3 and P4 are in turn connected in parallel with the series-connected transistors N3, P1, and P2. The source terminal of the transistor P3 is connected to the direct voltage source $V_{CC}$. An output signal $V_{OUT}$ is provided at the drain terminal of the transistor P2. By doing so, the maximum output voltage VOUT can have the same value as the direct voltage source $V_{CC}$. The stability of this input buffer can therefore be greater.

As for the NAND gate input buffer of the second preferred embodiment and the inverter input buffer of the third embodiment, similar modifications can also be used here to raise the maximum output voltage $V_{OUT}$ to $V_{CC}$.

DESCRIPTION OF THE PREFERRED EMBODIMENT 5

Figure 8:
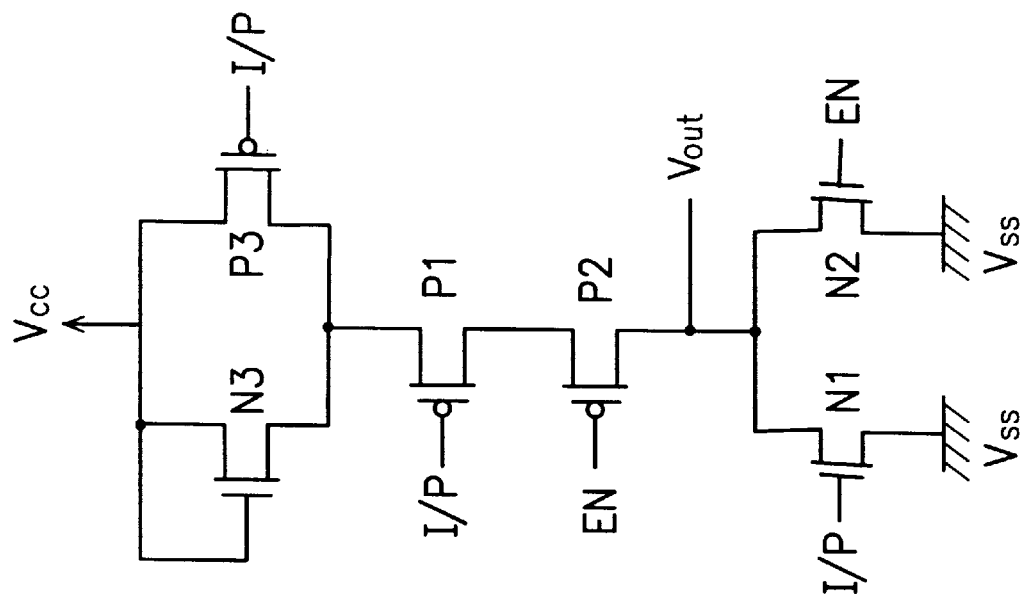
FIG. 8 is a circuit drawing showing a further preferred embodiment of a NOR gate input buffer according to the invention.

The fifth embodiment according to the invention as illustrated in FIG. 8, uses another method, for example, to enhance fan-out ability, and to enhance the ability to drive the next stage.

Referring to FIG. 8, it can be seen that compared with the first embodiment, the fifth embodiment has one more PMOS transistor, namely, transistor P3. The gate terminal of the transistor P1, the gate terminal of the transistor N 1, and the gate terminal of the transistor P3 all receive the input signal I/P. Both the gate terminal of the transistor P2 and the gate terminal of the transistor N2 receive the enable signal EN. Both the source terminal of the transistor N1 and the source terminal of the transistor N2 are connected to ground. The enhancement mode NMOS transistor N3 is connected between the direct voltage source $V_{CC}$ and the source terminal of the transistor P1. The transistor P3 is connected in parallel with the transistor N3. The source terminal of the transistor P3 is connected to the direct voltage source $V_{CC}$, and the drain terminal of the transistor P3 is connected to the source terminal of the transistor P1. That is, the transistor P3 and the transistor N3 are connected in parallel. An output signal $V_{OUT}$ is provided at the drain terminal of the transistor P2. By doing so, the maximum output voltage $V_{OUT}$ can have the same value as that of the direct voltage source $V_{CC}$. The stability of the input buffer can therefore be further improved.

As for the NAND gate Input buffer of the second embodiment and the inverter input buffer of the third embodiment, similar modifications can be used to raise the maximum output voltage $V_{OUT}$ to $V_{CC}$.

Therefore, a first characteristic of the invention is the connection of an enhancement mode NMOS transistor to the conventional CMOS input buffer. This has the effect of lowering the voltage potential $V_{GS}$ of the PMOS transistor of the input buffer. Therefore, the degree to which the PMOS transistor is turned on will be lowered effectively.

A second characteristic of the invention is that the pull-up PMOS transistor improves the functionality of the CMOS device. For example, the input buffer can be more fully turn-off. The stability of the voltage $V_{IH}$ is increased. The characteristic of the voltage level $V_{IH}$ will not vary greatly with the variation of the voltage level of the direct voltage source $V_{CC}$.

A third characteristic of the invention is the connection of one PMOS transistor or multiple PMOS transistors in series, between the direct voltage source $V_{CC}$ and the output voltage $V_{OUT}$. By doing so, the stability of the output voltage of the input buffer can be improved.

A fourth characteristic of the invention is the connection of one PMOS transistor and the enhancement mode NMOS transistor in parallel. By doing so, the stability of the output voltage of the input buffer can be improved.

While the invention has been described by way of examples and in terms of five preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A NOR gate input buffer, including:
    a first CMOS device having an NMOS transistor and a PMOS transistor, wherein a source terminal of the NMOS transistor of the first CMOS device is coupled to ground, and wherein the gates of the NMOS transistor and the PMOS transistor of the first CMOS device are both coupled to receive a first input signal;
    a second CMOS device having an NMOS transistor and a PMOS transistor, wherein a source terminal of the NMOS transistor of the second CMOS device is disposed to be coupled to ground, and wherein the NMOS transistor and the PMOS transistor of the second CMOS device each have a gate terminal for receiving a second input signal;
    a first PMOS transistor having a gate terminal for receiving the first input signal and a source terminal for coupling to the direct voltage source; and
    a second PMOS transistor connected in series with the first PMOS transistor, and having a gate terminal for receiving the second input signal
    a first enhancement mode NMOS transistor, wherein a drain terminal and a gate terminal of the first enhancement mode NMOS transistor are both coupled to be connected to a direct voltage source, and wherein a source terminal of the first enhancement mode NMOS transistor is coupled to a source terminal of the PMOS transistor of the first CMOS device.

2. An input buffer according to claim 1, wherein an output signal of the input buffer is provided at the drain terminal of the second PMOS transistor.

3. An input buffer, including:
    a first CMOS device having an NMOS transistor and a PMOS transistor, wherein a source terminal of the NMOS transistor of the first CMOS device is coupled to ground, and wherein the gates of the NMOS transistor and the PMOS transistor of the first CMOS device are both coupled to receive a first input signal;
    a second CMOS device having an NMOS transistor and a PMOS transistor, wherein a source terminal of the NMOS transistor of the second CMOS device is disposed to be coupled to ground, and wherein the NMOS transistor and the PMOS transistor of the second CMOS device each have a gate terminal for receiving to a second input signal;
    a first enhancement mode NMOS transistor, wherein a drain terminal and a gate terminal of the first enhancement mode NMOS transistor are both coupled to be connected to a direct voltage source, and wherein a source terminal of the first enhancement mode NMOS transistor is coupled to a source terminal of the PMOS transistor of the first CMOS device; and
    a third PMOS transistor which is connected in parallel with the first enhancement mode NMOS transistor, wherein the third PMOS transistor has a gate terminal for receiving the first input signal.

* * * * *